United States Patent [19]

Nagumo

[11] 4,179,711
[45] Dec. 18, 1979

[54] DEFECT NOISE COMPENSATING SYSTEM

[75] Inventor: Fumio Nagumo, Yokohama, Japan

[73] Assignee: Sony Corporation, Tokyo, Japan

[21] Appl. No.: 866,216

[22] Filed: Jan. 3, 1978

[30] Foreign Application Priority Data

Jan. 14, 1977 [JP] Japan .................................. 52/3314

[51] Int. Cl.² .............................................. H04N 3/14
[52] U.S. Cl. ................................................. 358/213
[58] Field of Search .................. 358/41, 212, 213, 209

[56] References Cited

U.S. PATENT DOCUMENTS

| | | | |
|---|---|---|---|
| 4,032,975 | 6/1977 | Malueg et al. | 358/213 |
| 4,045,816 | 8/1977 | Cave | 358/213 |

*Primary Examiner*—Richard Murray
*Attorney, Agent, or Firm*—Hill, Van Santen, Steadman, Chiara & Simpson

[57] ABSTRACT

A solid state television camera which is free from the noise caused by defects in semiconductor substrate is disclosed. A solid state image sensor having a plurality of picture elements aligned in vertical and horizontal direction is provided to derive a picked up output signal. A memory device is also provided which has a plurality of memory cells of the same arrangement as the image sensor. A mask is provided in front of the memory device, and the mask has an opaque pattern upon receipt of a light corresponding to a defect position of the image sensor. The image sensor and the memory are driven simultaneously, and the reading out of the signal from the image sensor is controlled by the readout signal from the memory which is corresponding to the defect position of the image sensor.

5 Claims, 14 Drawing Figures

DEFECT NOISE COMPENSATING SYSTEM

CROSS REFERENCE TO RELATED APPLICATIONS

My copending United States patent application, Ser. No. 790,090, filed on Apr. 22, 1977, discloses a solid state television camera with a noise eliminating function.

My earlier Japanese patent application, Ser. No. 150144/76, filed on Dec. 14, 1976, and corresponding United States patent application to be filed, discloses a solid state television camera with a noise eliminating function using a memory device.

BACKGROUND OF THE INVENTION

1. Field of the Invention

The present invention relates to a solid state television camera which uses a semiconductor element, for example, a charge coupled device as an image sensor, and especially to a solid state television camera which has means to greatly reduce noise caused by defects in the semiconductor crystal of the image sensor.

2. Description of the Prior Art

Solid state television cameras have been proposed in the prior art which use charge coupled devices (hereinafter referred to as CCDs) as solid state image sensors.

The CCD is constructed by forming a plurality of electrodes separated by a predetermined pitch on an insulating layer formed over all of one surface of a semiconductor substrate. The optical image of an object projected on the image sensor from the side of the electrodes or from the other side of the substrate. The optical image generates charge carriers under the electrodes in the substrate corresponding to the image of the object. The charge carriers under the electrodes are transferred by clock pulses applied to the electrodes, and read out successively from the CCD.

Various CCD imagers are known, so the detailed explanation of the CCD imagers will not be given in this specification.

Since in the CCDs, it is rather difficult to form the crystal of the semiconductor uniform over a predetermined area, crystal defects often are produced locally, and electric charges are apt to be produced at such defects by thermal causes, which cause an abnormally large dark current. As a result, when the camera using the above CCD picks up an object whose image is projected on the CCD, noise appears in an output picked up signal, at portions where the dark current is abnormally large. Then as shown in FIG. 1, the noise N is mixed in the picked up output signal SA and appears in the reproduced picture which is undesirable.

Figure 1:
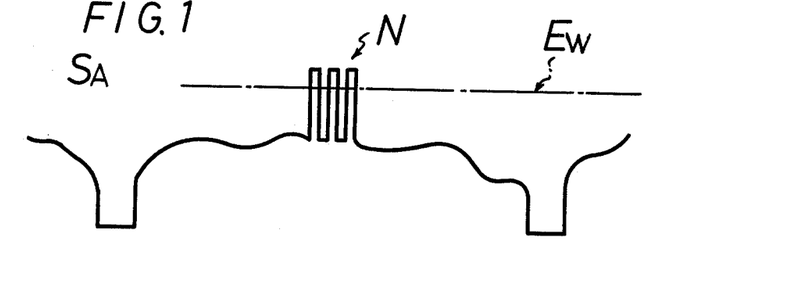
FIG. 1 is a waveform diagram showing a video signal including a noise caused by a defect of semiconductor crystal.

In the prior art, in order to remove such noise, it is proposed to control a sampling hold circuit to which the picked up output signal of CCD is supplied, by the output of a comparator which compares a level of the output signal of CCD with a predetermined level, for example, a level higher than a white level Ew as shown in FIG. 1. In this case, if the level of the output signal of CCD is higher than a predetermined level, the signal of the comparator holds the sampling hold circuit, thus, any abnormally high level output signal of CCD is not read out.

One improvement of the solid state television camera with noise eliminating function explained above is shown in copending United States patent application, Ser. No. 790,090, filed on Apr. 22, 1977, and assigned to the same assignee as the present application.

The level of the noise N which is caused by the defect depends greatly on the condition of the defect of semiconductor crystal. Some of them exceed the white level as described above, and some have a middle level between the white level and zero level, namely a grey level, where a normal output signal exists also. Thus, in the above prior art television camera, which compares the level of the output signal of the CCD with the predetermined level, noise exceeding the white level can be removed from the output signal of the CCD, but the noise of the grey level can't be removed.

OBJECTS AND SUMMARY OF THE INVENTION

Accordingly, it is an object of the present invention to provide an improved solid state television camera.

It is another object of the present invention to provide a solid state television camera, in which the noise which appears in output signal of solid state image sensor can be removed effectively.

It is a further object of the present invention to provide a solid state television camera in which even noise having a level below the white level can be removed effectively.

It is a still further object of the present invention to provide a solid state television camera, in which the noise which appears in output signal of solid state image sensor can be removed effectively with a simple construction.

It is a yet further object of the present invention to provide a defect noise compensating system for a solid state image sensor.

According to an aspect of the present invention, a solid state image sensor is provided having a defect noise compensating system therefor, as distinct from a correction system. The system includes means for suppressing defect noises contained in the output of an area having a defect in response to the identification signals appearing at the output of the memory device. The system includes means for reading out the whole contents of the memory device in accordance with the reading out order of the picture elements.

DESCRIPTION OF THE PREFERRED EMBODIMENTS

Before describing the circuit or system of the invention in detail, a novel non-volatile memory device made of a semiconductor which is used in the circuit of the invention, will be described first.

As the semiconductor memory device, a CCD is used similar to a well-known CCD device in construction. That is, this CCD has such a semiconductor element or device in which electrodes are formed on one surface of a semiconductor substrate through an insulating layer with a predetermined pitch to thereby form a number of memory portions or memory cells in the semiconductor substrate. In this case, information to be memorized in the semiconductor device are all applied thereto optically.

With the present invention, in order to make the memory device non-volatile, light image forming means is provided on one surface of the semiconductor substrate so as to cause an electrical output of charges formed as a function of an optical or light image corresponding to the informations to be memorized. By projecting a light on the semiconductor substrate through the light image forming means, the informations based upon an optical image are memorized by the semiconductor substrate at the corresponding memory cells.

Figure 3:
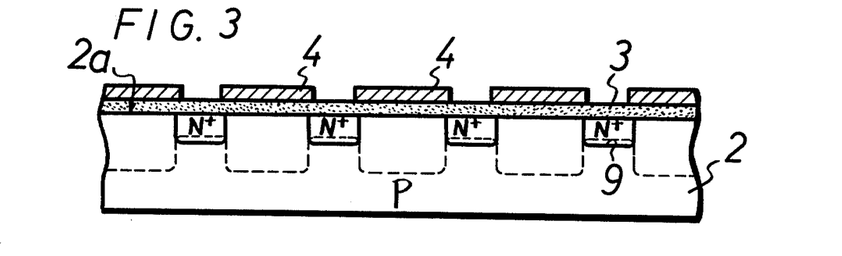
FIG. 3 is a cross-sectional view of FIG. 2.

The above non-volatile memory device will be described in detail. As shown in FIG. 3, on an upper surface $2a$ of a semiconductor substrate 2 there is formed an insulating layer 3 made of $SiO_2$ or the like, and thereon formed are a number of electrodes 4 with a predetermined pitch. When a predetermined voltage is applied to the plurality of electrodes 4, desired potential wells are produced under the electrodes 4 to which the voltage is applied (see the dotted lines in FIG. 3). Accordingly, beneath the electrodes 4, there are formed memory cells where carriers generated by the light information are stored. A channel stopper region 9 is provided, as shown in FIG. 3.

Figure 2:
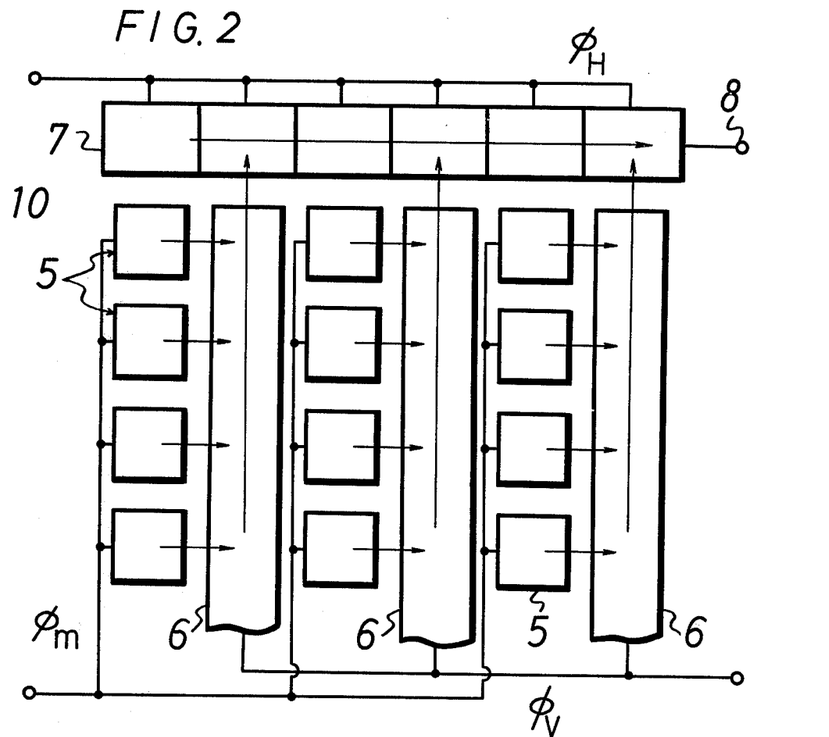
FIG. 2 is a construction diagram showing an example of the semiconductor device which can be used as a non-volatile memory device suitably employed in the camera of the invention.

FIG. 2 shows an arrangement of the memory cells in a semiconductor device 10. The example of FIG. 2 has a construction similar to that of an inter-line transfer system CCD. That is, a number of memory cells 5 (see FIG. 1) are formed in the vertical direction to form one vertical line. A vertical shift register 6 is provided for each vertical line of memory cells 5 so as to temporarily memorize or store memory contents. In FIG. 2, 7 designates a horizontal shift register common to all the vertical shift registers 6, and 8 designates an output terminal at which a memory output is derived from the horizontal shift register 7.

The memory cells 5 are supplied with a memory pulse $\phi_m$ so as to store the memory contents in the corresponding memory cells 5. Similarly, the vertical shift registers 6 are supplied with a transfer pulse (2 or 3 phase) $\phi_V$, and the horizontal shift register 7 is supplied with a read-out pulse $\phi_H$. As a result, the memory contents (electrical charges) stored in the respective memory cells 5 are transferred to the vertical shift registers 6 at the same time, then transferred to the horizontal shift register 7 by one bit and sequentially with the transfer pulse $\phi_V$ and then read out sequentially with the read-out pulse $\phi_H$.

In connection with the semiconductor device 10, there is provided such means which applies an information to be stored or memorized thereto optically. That is, in a memory element 1 (see FIG. 4), there is previously formed an optical image (signal pattern), corresponding to the information to be stored and this optical image is projected onto the semiconductor substrate 2 in which the memory cells 5 are formed so as to achieve the writing of the information. As the means to form the optical image, an optical mask is effective.

Figure 4:
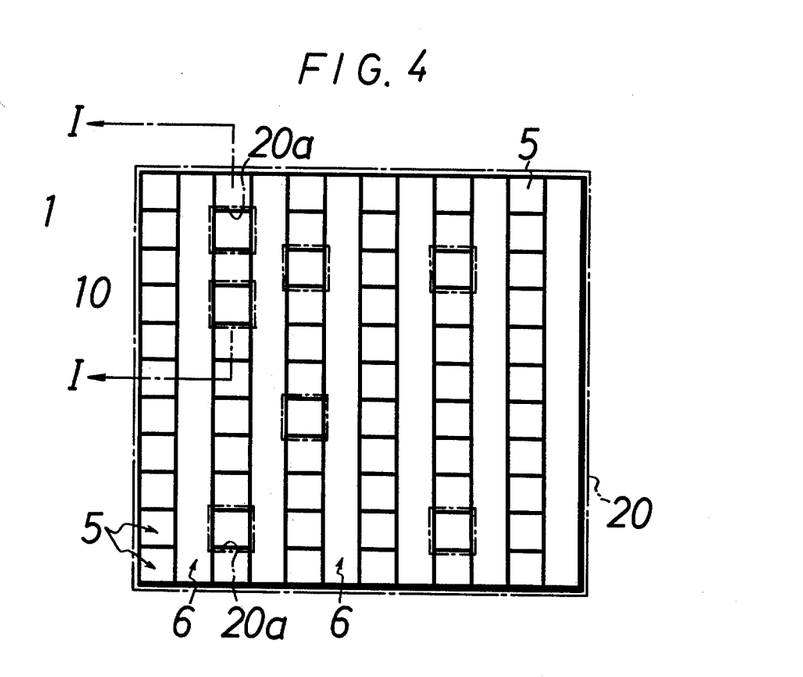
FIG. 4 is a schematic diagram of a mask formed on the semiconductor device.

To this end, as shown in FIG. 4, an optical mask 20, which has a signal pattern corresponding to the information to be stored, is coated on the upper surface of the memory cells 5. In the following description, as the information to be stored, digital data (informations) are conventionally exemplified. The memory of desired digital data represented by "0" and "1" is determined by whether a light is projected onto the memory cells 5 or not. Accordingly, if a transparent portion 20a is provided in the optical mask 20 in response to the digital data, an electrical charge is stored in response to the light energy under the memory cell 5 on which the light is projected through the transparent portion 20a. Therefore, the optical mask 20 shown in FIG. 4 is prepared and the semiconductor device 10 is driven under such a state that an optical image is projected thereon which optical image has the base on the signal pattern formed on the mask 20.

Figure 5:
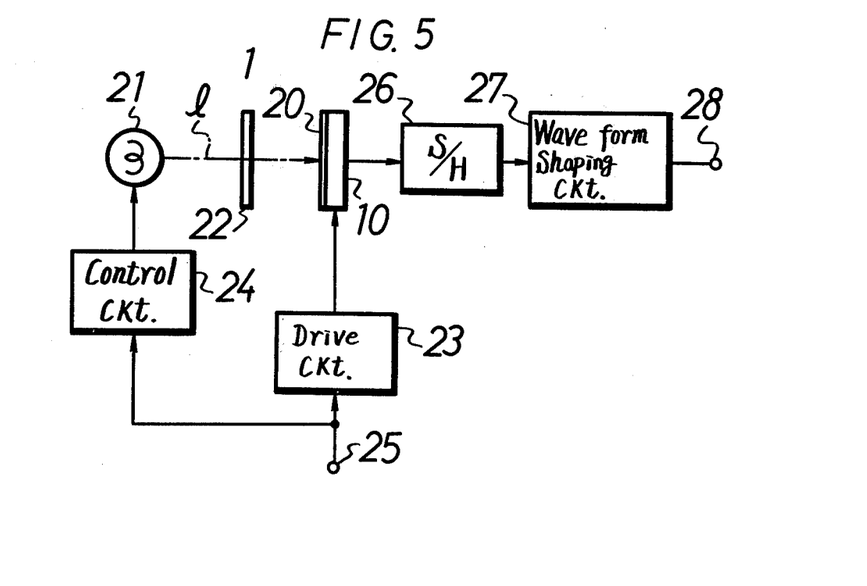
FIG. 5 is a block diagram showing an example of the system driving the non-volatile memory device.

FIG. 5 is a schematic block diagram showing an example of a system which will drive the non-volatile memory device or element 1. In FIG. 5, 21 designates a light source and 22 designates a diffusion plate. In this example, there is provided a drive circuit 23 which drives the memory device 1. This drive circuit 23 is controlled with a read command pulse applied to a terminal 25. This read command pulse is fed also to a control circuit 24 for the light source 21, so that only when the read command pulse is applied to the light source 21, will it operate. The drive circuit 23 produces the pulses which will be necessary to drive the semiconductor device 10, namely memory pulse $\phi_m$, transfer pulse $\phi_V$, and read-out pulse $\phi_H$, respectively, which are fed to the corresponding terminals. The output signal from the memory device 1, which is driven by the above pulses, is fed through a sampling hold circuit 26 to a waveform shaping circuit 27 which then develops a memory output corresponding to the stored digital data and delivers the same to a terminal 28.

In such a case where the light l from the light source 21 is projected through the optical mask 20 to the semiconductor device 10, even if the above memory read-out operation is repeated many times, a similar memory output can be obtained. Therefore, the above memory device 1 can be formed as a non-volatile memory device.

Figure 6A:
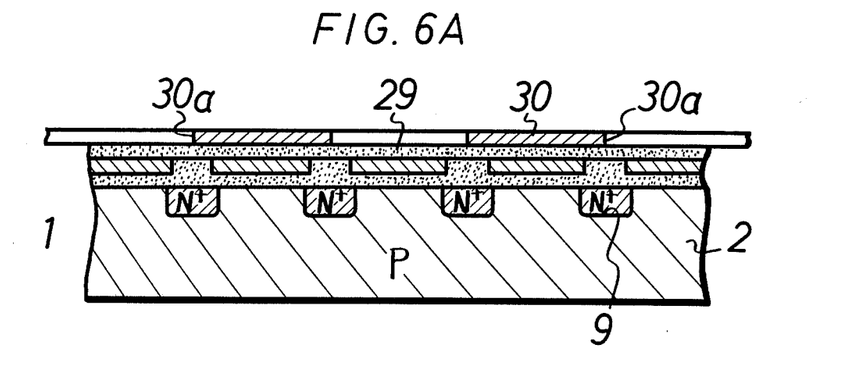
FIGS. 6A and 6B are cross-sectional views taken on the line I—I in FIG. 4 for explaining the process of making the mask.
Figure 6B:
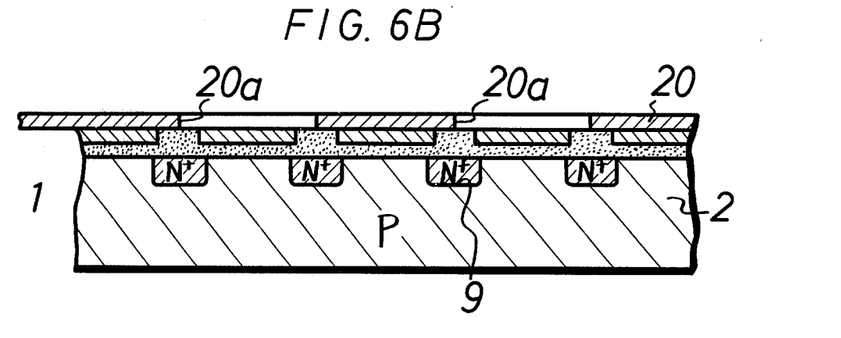

In order to form a desired signal pattern on the optical mask 20 if, by way of example, as shown in FIGS. 6A and 6B, a base 29 made of a material such as gelatin or the like is prepared, a dye mask 30 which has a signal pattern corresponding to the information to be stored is located on the base 29 and then the base 29 is dyed through windows 30a formed in the dye mask 30, the portions of base 29 corresponding to the windows 30a are only dyed to be opaque. In FIG. 6B, 20a designates a transparent portion of optical mask 20. In the case of the signal pattern on the line I—I in FIG. 4, the dye mask 30 shown in FIG. 6A is used, and after the dying the optical mask 20 shown in FIG. 6B is formed.

As another method to form the optical mask, there is such a method in which a silver salt layer is coated in place of the gelatin layer, a laser beam is irradiated on the silver salt layer along the image sensing cells of the CCD, the irradiation of the beam is switched on and off in accordance with the contents of the informations to be stored, and then a base is developed.

With this invention, since the ordinary CCD device is used effectively as set forth above, the optical mask 20 coincident with the information to be memorized is formed on the CCD memory device so as to project an optical image thereon, coincident with the informations to be stored, and the memory device 1 is driven under the light 1 being irradiated thereon through the optical mask 20, as described above, at the terminal 28 there is obtained the memory output which is the same as the information formed on the mask 20. That is, the nonvolatile memory device 1 can be easily constructed. In this case, the formation of optical mask 20 having the signal pattern corresponding to the information to be stored can be performed by the well known method, so that the memory device itself can be formed inexpensively.

In this invention, the above memory device 1 is used to memorize defects of semiconductor substrate of the imaging device. The writing of defects of the imaging device is carried out by the formation of an optical image. Accordingly, the signal pattern of mask 20 is formed to correspond to the portion of the memory device 1 where a CCD imaging device output contains noises due to defects. In this case, the level of the noise caused by crystal defects or the like is changed greatly by the condition of the crystal defects. Thus, there are such noises which have a level higher than the white level $E_W$ (see FIG. 1), and approximately the same as a grey level, that is, the same as the normal signals, so that it is necessary to process a noise signal with the level corresponding to the grey level as a noise due to defects so as to produce a good picture.

Figure 7A:
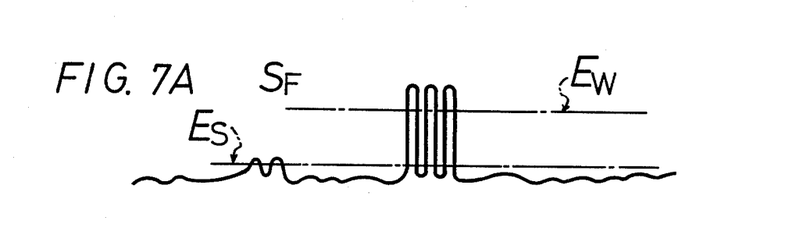
FIGS. 7A and 7B are waveform diagrams showing a video signal including noises and original signals for memory.
Figure 7B:
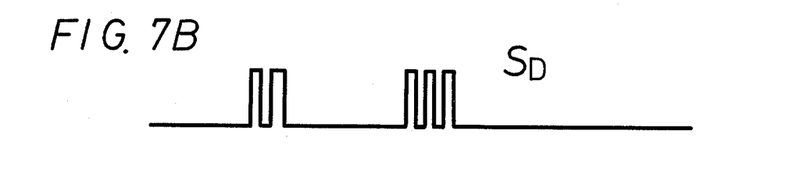

In order to detect the noise signal of the grey level, it is enough that, by way of example, under such a state that a solid state camera is optically shielded, an output is derived to produce a specific output $S_F$ (see FIG. 7A), an output $S_D$ (see FIG. 7B) thereof, which is higher than a grey level $E_S$, and which is taken as an original signal for memory, and a signal pattern coincident with this original signal is formed on the mask 20. By selecting a suitable reference level $E_S$, the proper identification of defect position can be achieved.

It may be better for writing the defect to consider the following point. That is, since the memory device 1 is also made of a semiconductor, its crystal defect presents a problem similar to the CCD as a solid state camera. It is necessary to use a CCD made of a semiconductor substrate of high quality and less crystal defects as a solid state camera, but if a semiconductor substrate of the same quality is used as a memory device, its cost increase is greatly increased, and hence such a camera apparatus can not be cheaply constructed. It may be necessary that even such a memory device having a semiconductor substrate with many crystal defects be used in practice.

If a crystal defect exists in a semiconductor substrate, there is a dendency that a dark current at the crystal defect increase. Therefore, even if there is no memory input (i.e., where no optical image is projected), when the memory device 1 is driven, an optical level corresponding to the portion where the crystal flaw exists becomes, of course, high. Accordingly, if as a memory input an output corresponding to the crystal defect and so on of the CCD is taken as a logic "1" (∴ the portion of mask 20 corresponding to the memory cell 5 passes a light therethrough), it becomes impossible to determine whether a memory output corresponds to an output of the crystal defect of the CCD itself or memory device itself.

While, if an output corresponding to the crystal defect is written in the memory device 1 as a logic "0" (∴ the portion of mask 20 corresponding to the memory cell 5 passes no light therethrough), or the signal pattern of mask 20 is formed as above, the above two can be discriminated.

Figure 8:
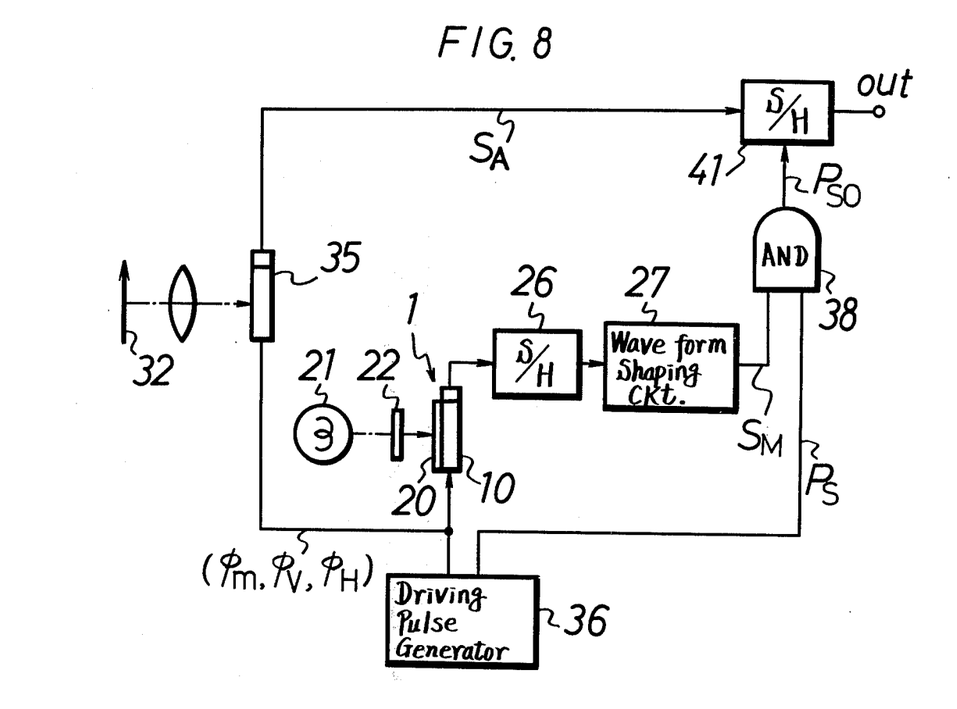
FIG. 8 is a systematic block diagram showing a main part of an example of the camera according to the present invention.

FIG. 8 is a schematic diagram showing an example of the noise eliminating system according to the present invention. In this example, as a CCD 35 of a solid state camera on which an image of an object 32 is projected through a lens system, a device formed similar to the semiconductor device used in the memory device 1 is employed, so that in the case of CCD 35, the memory cells 5 serve as image sensing cells or picture elements and the memory pulse $\phi_m$ becomes a pickup pulse.

In FIG. 8, 36 indicates a drive pulse generator which produces pulses necessary for driving the CCD 35 and memory device 1, but in this example, since the semiconductor devices of the CCD 35 and memory device 1 are formed the same as each other, the drive pulses can be used commonly. Hence, the CCD 35 and memory device 1 can be synchronized perfectly. 41 designates a sampling hold circuit for the picked-up output $S_A$. On the transmission path between the sampling hold circuit 41 and drive pulse generator 36 through which a sampling pulse $P_S$ is fed from the latter to the former, there is provided a gate circuit 38 consisting of an AND circuit which is supplied with a memory output $S_M$ from the memory device 1 as its gate signal.

Figure 9A:
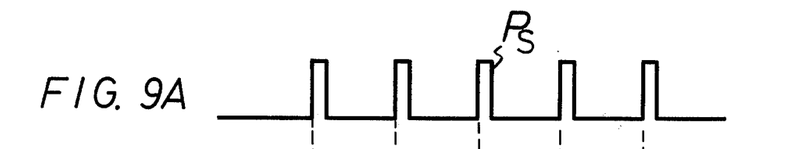
FIGS. 9A, 9B and 9C are waveform diagrams used for explaining the operation of the system shown in FIG. 8.
Figure 9B:
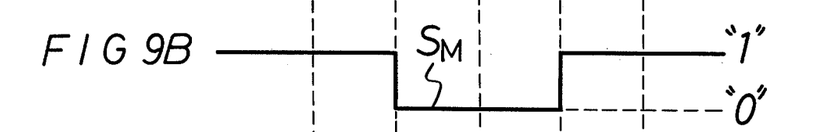
Figure 9C:
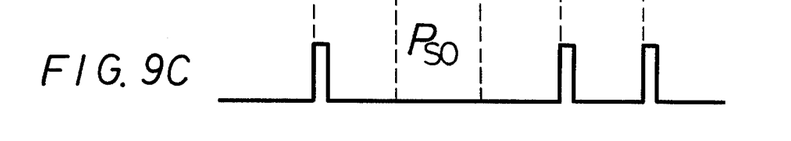

In this case, in synchronism with the driving of CCD 35, the reading-out operation from the memory device 1 is carried out, but since the position at which a noise N caused by a crystal defect or the like appears is already memorized in the memory device 1, at the time when the noise is sampled, the sampling pulse $P_S$ (refer to FIG. 9A) is not gated by the memory output $S_M$ of the logic "0", and accordingly, a sampling pulse $P_{SO}$ shown in FIG. 9C is fed from the gate circuit 38 to the sampling hold circuit 41. Therefore, during this time period, no sampling operation is carried out, and hence, during the noise appearing period, the picked-up output before that period is held as it is. Thus, the noise is eliminated and the signal is compensated for.

Within a period where no noise appears, since the content of the memory output $S_M$ is the logic "1", the sampling hold circuit 41 carries out its sampling operation normally and the picked up output $S_A$ based upon the light information of the object can be naturally obtained.

As described above, with the present invention, the memory device 1 is provided to memorize the position of the crystal defect and its output is used to control the sampling operation, so that any noise can be eliminated positively.

Further, in the invention the non-volatile memory device of specific construction is used as the memory device 1, so that it is sufficient only to provide a reading-out circuit for the memory device 1. The circuit construction can be simplified by this invention as compared with the case in which a volatile memory device is used. And, if the CCD 35 which is used which is the same as the cheap memory device being used, an extremely great beneficial result can be achieved.

Figure 10:
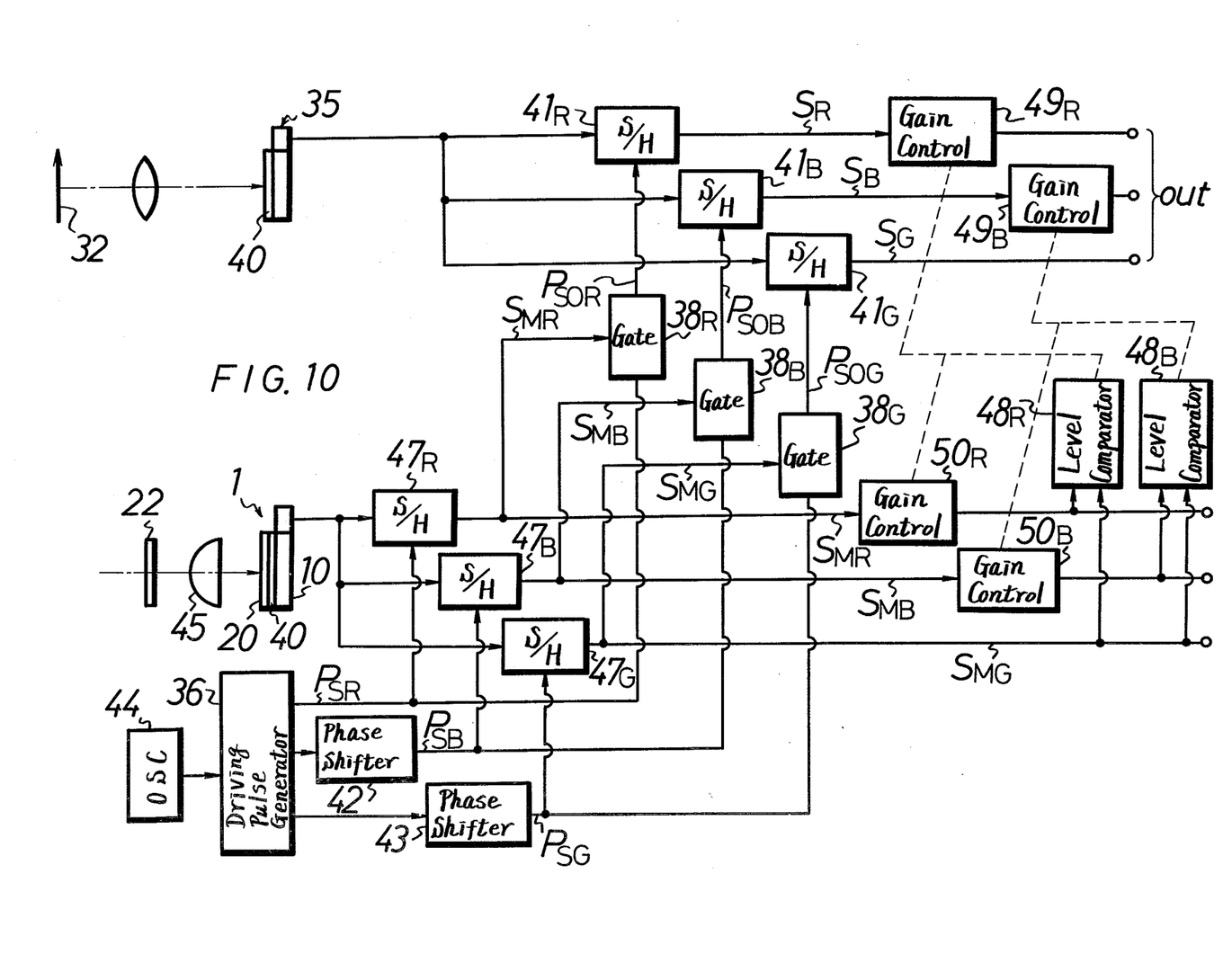
FIG. 10 is a schematic block diagram showing another example of the system of the invention.

FIG. 10 shows another example of the present invention. In this example, the invention is applied to a solid state color camera apparatus. In this case, an external light is used as the light source 21 to make it possible that, in addition to the above sampling control operation, the adjustment of the white balance can be achieved by the memory output.

In FIG. 10, 40 denotes a color filter which is formed of R (red), G (green) and B (blue) stripe filter elements of the vertical type, so that the picked up output from the CCD 35 is a dot sequential color signal of R, G and B. In order to form a color video signal from the dot sequential color signal, it is necessary to make the respective primary color signals of R, G and B simultaneous. To this end, sampling hold circuits 41R, 41G and 41B are provided. In the example of FIG. 10, the sampling hold circuits 41R to 41B are also used to sample the signals.

Among sampling pulses $P_{SOR}$, $P_{SOG}$ and $P_{SOB}$ supplied to the sampling hold circuits 41R to 41G, there is given a phase difference of 120°. A phase shifter 42 is provided to delay the pulse $P_{SOB}$ from the pulse $P_{SOR}$ by 120° and a phase shifter 43 is also provided to further delay the former from the latter by 120°. In FIG. 10, 44 designates a reference oscillator. The CCD 35 is driven by driving pulse based on the reference oscillator 44, so both the CCD 35 and the memory 1 are driven synchronously.

As described previously, on the transmission paths of the sampling pulses $R_{SOR}$ to $P_{SOB}$, there are provided gate circuits 38R, 38G and 38B, respectively.

In the example of FIG. 10, an external light is used as the light source of memory device 1. The external light is introduced through the diffusion plate 22 and a wide-angle lens 45 to the memory device 1 to irradiate the memory device 1 with an average light of a predetermined area including the object. As a result, the level of the memory output $S_M$ is fluctuated in response to the average external light. On the upper surface of the semiconductor substrate 2 of the memory device 1, there is coated a color filter 40 which is substantially the same as the above filter 40, and on the surface thereof, there is formed the mask 20.

In the case where the memory device 1 is constructed as above, since the memory output $S_M$ which corresponds to the average external light about the object can be obtained, the memory output $S_M$ is fed to the sampling hold circuits 47R, 47G and 47B from which memory outputs $S_{MR}$, $S_{MG}$ and $S_{MB}$ are obtained, respectively. If these memory outputs $S_{MR}$, $S_{MG}$ and $S_{MB}$ are fed to gate circuits 38R, 38G and 38B, respectively as the control signals thereof, the sampling hold circuits 41R, 41G and 41B, which are supplied with the picked-up signal including the noise as set forth previously, can be controlled to eliminate the noise.

Further, since the memory outputs $S_{MR}$, $S_{MG}$ and $S_{MB}$ may simultaneously have their level changed in response to the average external light, if one of the memory outputs, for example, the memory output $S_{MG}$ of G is taken as a reference, the levels of other memory outputs $S_{MR}$ and $S_{MB}$ are compared with the level of the reference memory output $S_{MG}$, the memory outputs $S_{MR}$ and $S_{MB}$ are controlled with the compared outputs to be equal to the memory output $S_{MG}$ and the levels of the signals $S_R$ and $S_B$ of the primary colors R and B are controlled by the compared outputs, the signals $S_R$, $S_G$ and $S_B$ of the primary colors R, G and B become constant in level. Thus, the white balance can be adjusted thereby. In FIG. 10, 48R and 48B designate comparator circuits for the above purpose, and 49R, 49B, 50R and 50B indicate gain control circuits, respectively.

As described above, if external light, including the object, is utilized as the light source, the noise can be eliminated and also the white balance can be adjusted by the simple construction.

It is apparent that the image sensor is not restricted to CCDs, and other devices, for example, Bucket Brigade Devices (BBDs) photo diode arrays, can be used.

Further, the noise signal can be replaced by the mean value of the output of the preceding picture element and the following picture element.

It will be apparent to those skilled in the art that many modifications and variations may be effected without departing from the spirit and scope of the novel concepts of the present invention.

We claim as our invention:

1. A defect noise compensating system for a solid state television camera which employs a solid state area imaging device having a predetermined number of picture elements aligned in both horizontal and vertical directions, optical means for projecting an image of an object on said solid state area imaging device, generator means for supplying a drive signal to said area imaging device, and means for deriving a video signal corresponding to said image out of said area imaging device, said defect noise compensating system comprising:
    (a) memory means having a plurality of memory cells each corresponding to each of said picture elements of the area imaging device, wherein predetermined memory cells corresponding to deteriorated picture elements delivers identification signals for defect noise occurrence,
    (b) means for reading out the whole contents of said memory device in accordance with the reading out order of said picture elements, and
    (c) means for suppressing defect noises contained in the output of said area imaging device in response to the identification signals appearing at the output of said memory device,
    said memory means including a memory device having a plurality of photo sensitive elements as memory cells, and a photo mask to be positioned in front of said memory device, said photo mask being coded in accordance with the defect positions of said picture elements.

2. A defect noise compensating system as claimed in claim 1, wherein said photo mask is coded as for the positions corresponding to the defects of said picture elements to be opaque to the light.

3. A defect noise compensating system for a solid state television camera which employs a solid state area imaging device having a predetermined number of picture elements aligned in both horizontal and vertical directions, optical means for projecting an image of an object on said solid state area imaging device, generator means for supplying a drive signal to said area imaging device, and means for deriving a video signal corresponding to said image out of said area imaging device, said defect noise compensating system comprising:
    (a) memory means having a plurality of memory cells each corresponding to each of said picture elements of the area imaging device, wherein predetermined memory cells corresponding to deteriorated picture elements delivers identification signals for defect noise occurrence, (b) means for reading out the whole contents of said memory device in accordance with the reading out order of said picture elements, and (c) means for suppressing defect noises contained in the output of said area imaging device in response to the identification signals appearing at the output of said memory device, said area imaging device being constructed in the form of charge-coupled device and said memory means including a charge-coupled device having the same construction as that of said area imaging device and said drive signal from the generator means is commonly supplied to the both.

4. A defect noise compensating system as claimed in claim 3, wherein said memory means further includes a photo mask having coded apertures corresponding to the defect positions of said picture elements.

5. A solid state television camera comprising:
(a) a solid state image sensor having a plurality of picture elements aligned in both horizontal and vertical directions, deriving a picked up output signal of an image of an object projected on it,
(b) a memory having a plurality of memory cells aligned in both horizontal and vertical directions corresponding to the alignment of said picture elements,
(c) a photo mask positioned in front of said memory having a predetermined pattern corresponding to positions of deteriorated picture elements of said image sensor,
(d) a read-out pulse generator deriving read-out of both said image sensor and the memory simultaneously, and
(e) a control circuit controlling the read-out of said picked up output signal from said image sensor in response to a read-out signal of said memory.

* * * * *